(12) United States Patent
Sato et al.

(10) Patent No.: US 7,816,746 B2
(45) Date of Patent: Oct. 19, 2010

(54) SPIN-TUNNEL TRANSISTOR AND MAGNETIC REPRODUCING HEAD

(75) Inventors: Rie Sato, Kanagawa-ken (JP); Koichi Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 10/669,007

(22) Filed: Sep. 24, 2003

(65) Prior Publication Data
US 2004/0124484 A1     Jul. 1, 2004

(30) Foreign Application Priority Data
Sep. 24, 2002   (JP)   ............... P2002-276636

(51) Int. Cl.
H01L 21/70 (2006.01)
H01F 10/00 (2006.01)
(52) U.S. Cl. ............... 257/421; 257/E21.665; 257/E27.005; 257/E43.004; 365/158; 365/171; 365/173
(58) Field of Classification Search .......... 257/421, 257/422, 423, 295, E27.005, E43.004; 360/314; 365/158, 171, 173; 324/252; 428/212
See application file for complete search history.

(56) References Cited

U.S. PATENT DOCUMENTS

| | | | | |
|---|---|---|---|---|
| 5,747,859 A | * | 5/1998 | Mizushima et al. | 257/421 |
| 5,973,334 A | * | 10/1999 | Mizushima et al. | 257/25 |
| 6,069,820 A | * | 5/2000 | Inomata et al. | 365/171 |
| 6,178,112 B1 | * | 1/2001 | Bessho et al. | 365/173 |
| 6,480,365 B1 | * | 11/2002 | Gill et al. | 360/324.11 |
| 6,501,143 B2 | * | 12/2002 | Sato et al. | 257/421 |
| 6,707,084 B2 | * | 3/2004 | Katti et al. | 257/295 |
| 7,309,888 B2 | * | 12/2007 | Johnson | 257/295 |
| 2001/0040777 A1 | * | 11/2001 | Watanabe et al. | 360/321 |
| 2002/0076837 A1 | * | 6/2002 | Hujanen et al. | 438/3 |

(Continued)

FOREIGN PATENT DOCUMENTS

CN    1185630 C  *  8/2001

(Continued)

OTHER PUBLICATIONS

Sabastiaan van Dijken et al, "Comparison of Magnetocurrent and transfer ratio in magnetic tunnel transistors with spin-valve bases containing Cu and Au spacer layers", Applied Physics Letters, Feb. 3, 2003, vol. 82, No. 5, pp. 775-777.

(Continued)

*Primary Examiner*—Zandra Smith
*Assistant Examiner*—Tsz K Chiu
(74) *Attorney, Agent, or Firm*—Kimble Intellectual Property Law, PLLC (57) ABSTRACT

A spin-tunnel transistor having a tunnel barrier layer formed of an antiferromagnetic material which is exchange coupled with a first or second ferromagnetic metal layer of a base B formed adjoining to the antiferromagnetic material, so as to fix magnetization of the adjoining ferromagnetic layer. The base B includes a nonmagnetic metal layer which is formed between the first and second ferromagnetic metal layers and decouple magnetization coupling between the first and second ferromagnetic metal layers. The base B is formed between a collector and an emitter to form tri-terminal device. Those spin-tunnel transistor may be used as a sensor of a magnetic reproducing head used in a hard disk drive.

10 Claims, 4 Drawing Sheets

U.S. PATENT DOCUMENTS

| | | | |
|---|---|---|---|
| 2002/0086182 A1* | 7/2002 | Fujikata et al. | 428/692 |
| 2002/0097537 A1* | 7/2002 | Shimazawa | 360/324.2 |
| 2002/0105827 A1* | 8/2002 | Redon et al. | 365/173 |
| 2003/0042903 A1* | 3/2003 | Hasegawa et al. | 324/252 |
| 2003/0164509 A1* | 9/2003 | Gregg | 257/197 |
| 2004/0061978 A1* | 4/2004 | Kawato | 360/314 |
| 2005/0030674 A1* | 2/2005 | Carey et al. | 360/324.11 |
| 2005/0068691 A1* | 3/2005 | Kagami et al. | 360/324.2 |

FOREIGN PATENT DOCUMENTS

JP 2001156357 A * 6/2001

OTHER PUBLICATIONS

Sebastiann van Dijken et al., "Room temperature operation of a high output current magnetic tunnel transistor", Applied Physics Letters, May 6, 2002, vol. 80, No. 18, pp. 3364-3366.

* cited by examiner

SPIN-TUNNEL TRANSISTOR AND MAGNETIC REPRODUCING HEAD

CROSS-REFERENCE TO RELATED APPLICATION

This application claims priority of Japanese Patent Application No. 2002-276636, filed Sep. 24, 2002, the entire contents of which are incorporated herein by reference.

BACKGROUND OF THE INVENTION

1. Field of the Invention

The present invention relates to a spin-tunnel transistor, which may be used as a magnetic sensor such as a magnetic head for reproduction of high-density magnetic memory or a magnetic memory such as a random access memory.

2. Discussion of the Related Art

The development of ferromagnetic reproducing heads promoted high-density and high-speed information technology. For example, the development of Giant MagnetoResistance effect device (GMR device) for high-power ferromagnetic reproducing increased a recording density of magnetic medium of annual rate by 100%.

The GMR device has a sandwich-structured laminate film including a ferromagnetic metal layer, a nonmagnetic metal layer and a ferromagnetic metal layer. The laminate film is often referred to as a "spin valve film". In this spin valve film, one ferromagnetic metal layer has a substantially pinned magnetization, which is fixed by a ferromagnetic coupling bias applied thereto by an exchange coupling between the ferromagnetic metal layer and an antiferromagnetic metal layer formed adjacent to the ferromagnetic metal layer. The magnetization pinned layer of ferromagnetic metal material may be referred to as "a magnetization pinned layer", while another ferromagnetic metal layer has a magnetization free to rotate in an applied magnetic field (usually signal magnetic field) is usually referred to as "a magnetization free layer".

When a magnetic field is applied to the spin valve film, relative angles between the magnetization directions of the two ferromagnetic metal layers changes, and the resistance of the spin valve changes by the change of the relative angle. For example, the resistance of the spin valve film becomes the smallest when the two magnetizations are antiparallel to each other, while the resistance of the spin valve film becomes the largest when the two magnetizations are parallel to each other. A voltage or current detector is usually coupled to the spin valve film and senses the resistance change of the spin valve film by detecting the current or voltage change between two terminals of the spin valve film, whereby a change of applied magnetic field being detected.

A TMR (Tunneling MagnetoResistance) device is also being developed for magnetic recording of higher density. The TMR device has a laminate film of a ferromagnetic metal layer, a tunnel barrier layer and a ferromagnetic metal layer, in which a voltage is applied between these ferromagnetic metal layers. A resistance change between the two ferromagnetic metal layers is detected by sensing a change of tunnel current flowing through the three layers. In the TMR device, the tunnel current varies depending on the relative angle of two magnetizations of the ferromagnetic metal layers, therefore a change of applied magnetic field can be sensed by detecting the tunnel resistance change.

A three-terminal spin valve transistor, which is different from two-terminal sensors like TMR device and GMR device, is also being developed. The three-terminal spin valve transistor comprises an emitter, a base and a collector, and the base therein may have several ferromagnetic metal layers and nonmagnetic metal layer formed between the ferromagnetic metal layers. The emitter and the collector of the three-terminal spin valve transistors may have semiconductor, whereby forming a transistor of SMS (Semiconductor-Metal-Semiconductor) structure, where the metal base is sandwiched by the emitter and collector. Also, transistors of MIMS (Metal-Insulator-Metal-Semiconductor) structure and MIMIM (Metal-Insulator-Metal-Insulator-Metal) structure are also proposed. Each of the MIMS and MIMIM structures comprises a tunnel barrier layer of a dielectric insulator material between the emitter and the base or between the base and the collector. Based on a spin-tunnel phenomenon in the Metal/Insulator/Metal junction, they are a type of spin valve transistor having the MIM structure may be referred to as spin-tunnel transistor.

In the spin-tunnel transistor, hot electrons are formed by current flow at the tunnel junction and they scatter in the base caused by its spin direction. The base usually has two ferromagnetic metal layers and a nonmagnetic metal layer between the two ferromagnetic metal layers. The hot electrons' scatter becomes the largest when a relative angle between two metal layers of ferromagnetic material in the base becomes the largest (both of magnetization directions are antiparallel to each other), whereby decreasing the collector current. When the relative angle between the two metal layers of ferromagnetic material in the base becomes the smallest (both of the magnetization directions are parallel to each other), collector current increases. The direction of signal magnetic field can be detected by sensing the change of the collector current, One of the two metal layers of ferromagnetic material may have a magnetization free to rotate in an applied magnetic field, the other of the two metal layers of ferromagnetic material may have a magnetization fixed in the applied magnetic field, and the interposed nonmagnetic layer decouples the magnetic coupling between the two ferromagnetic metal layers, thereby forming a spin valve structure with the interposed nonmagnetic metal layer.

Examples of the spin-tunnel transistors are disclosed in a prior U.S. patent application Ser. No. 10/400,569, the entire contents of which are incorporated herein by reference.

SUMMARY OF THE INVENTION

The magnetization pinned layer of ferromagnetic material for a practical use should have stable magnetization, which substantially keep its intended original direction of magnetization in an applied magnetic field so that the spin valve transistor can attain effective signal noise ratio and magnetoresistance ratio. An antiferromagnetic material such as IrMn may be formed in contact with the magnetization pinned layer of ferromagnetic material in the base so that an exchange coupling between the magnetization pinned layer of ferromagnetic material and the antiferromagnetic material layer stably fixes the magnetization of the pinned layer. However, the insertion of the antiferromagnetic material layer may increase hot electrons scatter, which is not caused by its spin direction, in the antiferromagnetic material layer and interfaces with adjoining layer, thereby decreasing the collector current and deteriorating MagnetoResistance Ratio (MR ratio) of the spin-tunnel transistor.

One object of the present invention is to provide a spin-tunnel transistor of large collector current and high MR ratio with the magnetization pinned layer having a stable magnetization.

According to one aspect of the present invention, there is provided a spin-tunnel transistor having an emitter, a collector formed adjacent to the emitter, a base formed between the emitter and the collector and a tunnel barrier layer of antiferromagnetic material. The tunnel barrier layer is formed between the emitter and a magnetization pinned layer of ferromagnetic material in the base or between the collector and a magnetization pinned layer of ferromagnetic material. The magnetization pinned layer of ferromagnetic material is formed in the base. The base further comprises a magnetization free layer of ferromagnetic material and a nonmagnetic layer between the magnetization pinned layer of ferromagnetic material and the magnetization free layer of ferromagnetic material. The free layer has a magnetization substantially free to rotate under an applied magnetic field, usually a signal magnetic field. The tunnel barrier layer of antiferromagnetic material is provided with an exchange coupling with the adjoining magnetization pinned layer of ferromagnetic material in the base, thereby the magnetization of the pinned layer of ferromagnetic material being stably fixed by the exchange coupling between the magnetization pinned layer of ferromagnetic material and the tunnel barrier of antiferromagnetic material.

This provides a spin-tunnel transistor, which prevents both the collector current and the MR ratio from being lowered and is therefore suitable for its practical use.

The spin-tunnel transistor may be formed on one and the same substrate having a field-effect transistor formed thereon, and is characterized in that the output of the spin valve transistor is electrically coupled to a gate electrode of the field-effect transistor.

A magnetic reproducing head of a second aspect of the present invention comprises the above-described spin-tunnel transistor. The magnetic head may further comprise a flux guide magnetically coupled to the magnetization free layer of ferromagnetic material of the spin-tunnel transistor, and is characterized in that it leads the signal magnetic field from a recording medium to the magnetization free layer via the flux guide. In the above constitution, the spin-tunnel transistor may be well spaced from the recording medium and a durability of the transistor increases, even though a collision between the magnetic head and the recording medium occurs. The magnetic reproducing head having the transistor is suitable for high recording density.

BRIEF DESCRIPTION OF SEVERAL VIEWS OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Referring now to the drawings, wherein like reference numerals designate identical or corresponding parts throughout the several views, the present invention will be described.

First Embodiment

Figure 1:
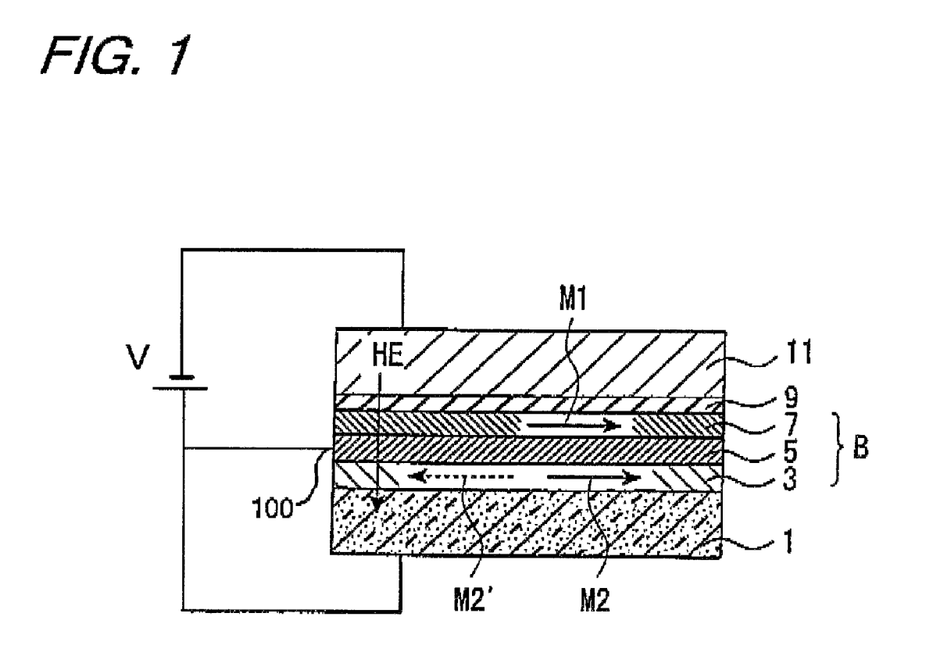
FIG. 1 is a schematic cross-sectional view showing a spin-tunnel transistor of the first embodiment of the present invention.

FIG. 1 is a schematic cross-sectional view showing a spin-tunnel transistor of the first embodiment of the present invention.

The spin-tunnel transistor of the present embodiment includes a collector of semiconductor material 1, an emitter of a nonmagnetic metal layer 11, a base B formed between the collector of semiconductor material 1 and the emitter of nonmagnetic metal layer 11 and a tunnel barrier layer 9 formed between the base B and the emitter of nonmagnetic metal layer 11.

The semiconductor material 1 may be a semiconductor substrate or semiconductor layer(s) formed on a predetermined substrate. The emitter of a nonmagnetic metal layer 11 may be a laminate film of multiple nonmagnetic metal layers. In the spin-tunnel transistor, each of the emitter of nonmagnetic metal layer 11, the base B, and the collector of semiconductor material 1 has respective electrode, via which the transistor is coupled to a current providing circuit and an external voltage/current sensing circuit.

The base B has a spin valve structure that includes a ferromagnetic metal layer 3, a nonmagnetic metal layer 5, and a ferromagnetic metal layer 7, wherein the nonmagnetic metal layer 5 is interposed between the ferromagnetic metal layer 3 and the ferromagnetic metal layer 7 and decouples exchange coupling between the ferromagnetic metal layers 3 and 7. In this spin-tunnel transistor of FIG. 1, the ferromagnetic metal layer 3 is a magnetization free layer of ferromagnetic material and the ferromagnetic metal layer 7 is a magnetization pinned layer of ferromagnetic material.

A tunnel barrier layer 9 of antiferromagnetic dielectric material is formed between the magnetization pinned layer of ferromagnetic material 7 of base B and the nonmagnetic metal layer 11. The tunnel barrier layer 9 of antiferromagnetic dielectric material and the magnetization pinned layer of ferromagnetic material 7 are exchange coupled to each other, whereby the magnetization M1 of the pinned layer being fixed in one direction, usually in parallel with its film plane in measuring range of signal magnetic field. Therefore, antiferromagnetic characteristic of the tunnel barrier layer should be sufficient to sustain exchange coupling between the tunnel barrier layer 9 and the neighboring magnetization pinned layer 7.

The tunnel barrier layer 9 of dielectric material is thin enough to ensure tunnel conduction through a tunnel junction between the adjacent two layers so that hot electrons are formed by the tunnel conduction and injected into the base B.

The other ferromagnetic metal layer 3 has a magnetization M2, which is free to change its direction in response to the signal magnetic field of the measuring range. The magnetization free layer 3 has an initial magnetization in zero magnetic fields, and the initial magnetization of the free layer 3 may be in parallel to its layer surface and substantially perpendicular to the fixed magnetization of the pinned layer 7.

The signal magnetic field may be an external magnetic field applied to the spin-tunnel transistor tunnel from a magnetic medium such as a magnetic disc or other magnetic field providing device. The magnetization direction of the free layer 3 varies depending on the change of the external magnetic field applied to the transistor, thereby changing the relative angle of magnetizations between the two magnetic layers 3 and 7 between parallel and anti-parallel states. When the magnetization M2 of the magnetization free layer 3 is in parallel with the magnetization M1 of the pinned layer 7, resistance of the spin valve structure becomes the largest. When the magnetization M2' is in antiparallel with the magnetization M1 of the magnetization pinned layer 7, resistance of the spin valve structure becomes the smallest. This resistance change is measured by change of collector current of the spin-tunnel transistor.

Figure 2:
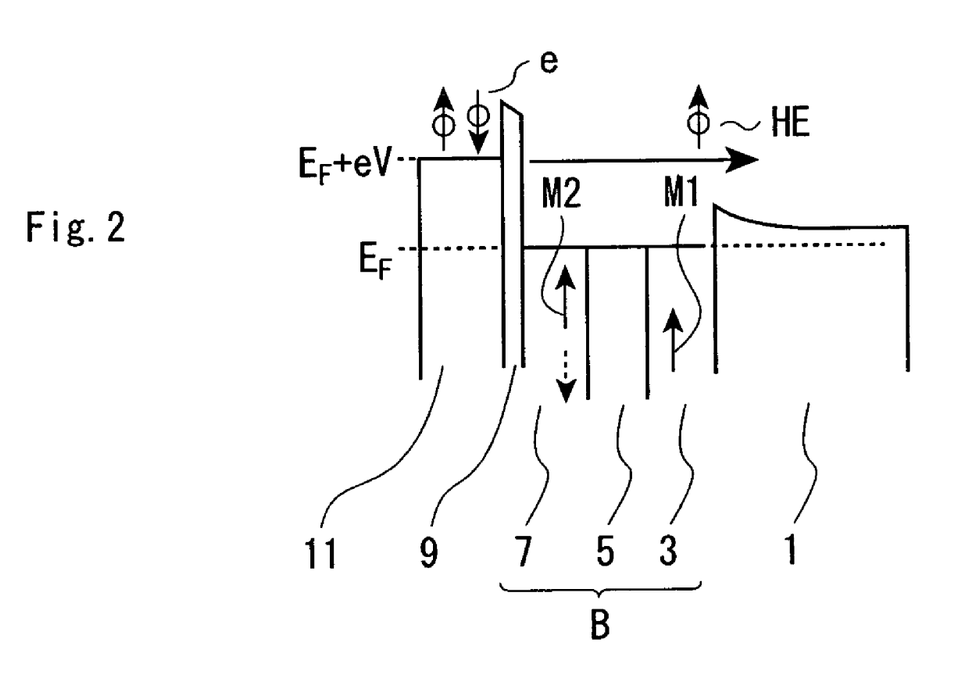
FIG. 2 is an energy diagram of the spin-tunnel transistor of FIG. 1.

FIG. 2 is an energy diagram of the spin-tunnel transistor of the present embodiment.

A voltage V is applied between the nonmagnetic metal layer 11 of the emitter and the base B. Electrons e are injected from the nonmagnetic metal layer 11 of the emitter to the base B through the tunnel barrier layer 9, thereby producing and injecting hot electrons HE in the base B. The injected hot electrons HE scatter in the base B depending on their spin, and a part of the injected hot electrons HE reach the collector of the semiconductor material 1 over a Schottky barrier formed between the ferromagnetic metal layer 3 and the collector 1.

The hot electrons thus having reached the collector of the semiconductor substrate 1 form a collector current, which is then taken outside via a collector terminal (not shown). $E_F$ of FIG. 2 indicates the Fermi energy level.

The MR ratio of spin-tunnel transistor results from the conductivity/resistance difference between up-spin electrons of which the spin magnetization is parallel to the magnetization of magnetic layer in the transistors and down-spin electrons of which the spin magnetization is anti-parallel to magnetization of the metal layer. This means that the conductivity of hot electrons HE of which the spin magnetization is parallel to the magnetization of the magnetic layers 3 and 7 in the spin-tunnel transistor of this embodiment is higher than that of the hot electrons HE of which the spin magnetization is anti-parallel to the magnetization of either one of the ferromagnetic metal layers 3 and 7.

Antiferromagnetic metal such as IrMn, PtMn, RuRhMu, or PtPdMn strongly scatters the hot electrons irrespective of the direction of its spin magnetization in the antiferromagnetic metal or at an interface between the antiferromagnetic metal and its adjoining ferromagnetic material. Therefore, an antiferromagnetic metal layer in the base B lowers the collector current and the MR ratio of the spin-tunnel transistor.

In the spin-tunnel transistor of the present embodiment, the tunnel barrier layer 9 is formed of an antiferromagnetic dielectric material, and the magnetization of the magnetic layer 7 is pinned by the exchange coupling between the two layers 7, 9. Without inserting the antiferromagnetic metal layer into the Base, the spin-tunnel transistor of the present embodiment can prevent the reduction of the collector current and MR ratio.

The antiferromagnetic dielectric material for the tunnel barrier layer 9 is preferably an antiferromagnetic oxide having a high Neel temperature, for example NiO, CoO, $Fe_2O_3$, or their equivalents. Other antiferromagnetic dielectric material may also be used for the tunnel barrier layer 9.

Figure 3:
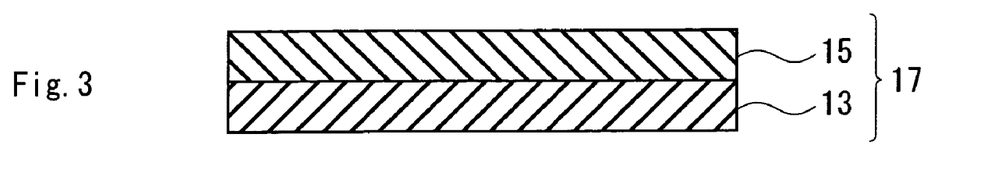
FIG. 3 is a schematic cross-sectional view showing other example of a tunnel barrier layer.

The tunnel barrier layer 9 may have a laminate structure 17 of an antiferromagnetic layer 13 and a nonmagnetic dielectric layer 15 of $AlO_x$ or the like, as in FIG. 3. The laminate structure 17 reduces a leak current that may be caused by the defect in the antiferromagnetic dielectric layer 13. The additional dielectric layer may be formed of AlNx, AlHfOx, HfOx, HfON, MgO, or their equivalents.

For the two ferromagnetic metal layers 3, 7, elements of ferromagnetic metal material, for example Co, Fe, Ni, can be used and an allow of ferromagnetic metal material of Co, Fe, Ni an also be used. The nonmagnetic metal layer 5 may include Cu, Ag, Au, Cr, or other nonmagnetic metal material and the decoupling of the two ferromagnetic metal layers may be attained by control of thickness of the nonmagnetic metal layer 5.

Second Embodiment

Figure 4:
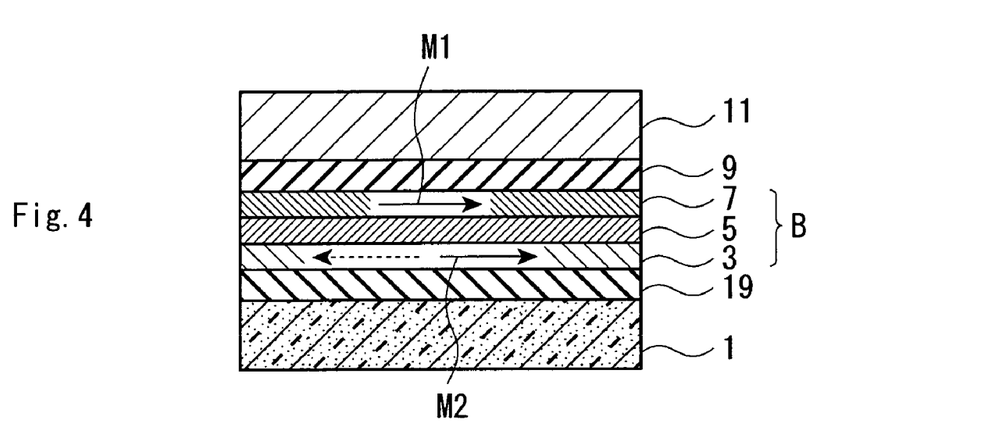
FIG. 4 is a schematic cross-sectional view showing a spin-tunnel transistor of a second embodiment of the present invention.

FIG. 4 is a schematic cross-sectional view showing a spin-tunnel transistor of the second embodiment of the present invention. The spin-tunnel transistor of the present embodiment differs from that of the first embodiment in that tunnel junctions are formed not only at an interface between the base and the emitter but also at an interface between the base and the collector.

For the tunnel junction between the base B and the collector, a second tunnel barrier layer 19 is provided between the semiconductor substrate 1 of the collector and the ferromagnetic metal layer 3 of base B. The other tunnel barrier layer adjoining the magnetization pinned layer is formed of an antiferromagnetic dielectric material. In FIG. 4, the ferromagnetic metal layer 7 is a magnetization pinned layer and its magnetization M1 is fixed by an exchange coupling with the tunnel barrier layer of antiferromagnetic dielectric 9.

The second tunnel barrier layer 19 is not used to fix the magnetization of adjoining ferromagnetic metal layer 3 and is formed of a nonmagnetic dielectric material, for example AlOx, Si, Ge, HfSiOx, or their equivalents.

Third Embodiment

Figure 5:
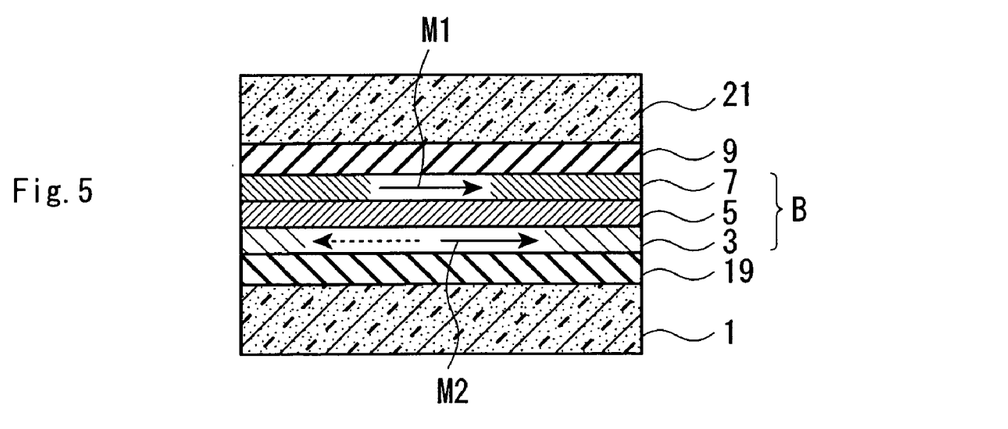
FIG. 5 is a schematic cross-sectional view showing a spin-tunnel transistor of the second embodiment of the present invention.

FIG. 5 is a schematic cross-sectional view showing a spin-tunnel transistor of the third embodiment of the present invention.

While the emitter of the prior embodiments are metal layers, the spin-tunnel transistor of the present embodiment differs from that of those embodiments in that the emitter is a semiconductor layer 21. In other words, the transistor of the present embodiment has a metal-insulator-semiconductor junction (MIS junction) between the base B and the emitter of the semiconductor layer 21. Preferable material for the emitter of semiconductor material may be formed Si, Ge, a compound of group III elements and group V elements, $SrTiO_3$, or their equivalents.

Also in the present embodiment, the tunnel barrier layer 9 is formed of an antiferromagnetic dielectric material and magnetically exchange-coupled with the magnetic metal layer 7, thereby fixing the magnetization M1 of the adjoining ferromagnetic metal layer 7.

At the MIS junction, a necessary voltage for injecting Hot Electrons HE into the base B is lower than that at the MIM junction. Therefore, deterioration of the tunnel barrier layers 9 and 19 by application of high voltages to the junction can be effectively prevented.

Example 1

In Example 1, a spin-tunnel transistor of FIG. 1 using the structure of FIG. 3 was fabricated.

The spin-tunnel transistor of the present example comprised the collector layer 1 of a non-doped GaAs on an n-GaAs substrate, the base B having the ferromagnetic metal layer 3 of Fe, a nonmagnetic metal layer 5 of Cu and a ferromagnetic metal layer 7 of Co, the tunnel barrier layer 9 of the laminate structure 17 of FIG. 3, and the emitter 11 of Al. The tunnel barrier layer 9 of the laminate structure 17 comprised a CoO layer 13 and an $Al_2O_3$ layer 15, wherein the CoO layer was formed on the Co layer 7 and the $Al_2O_3$ layer 15 was formed on the emitter 11.

The laminate structure of the spin-tunnel transistor was formed, using a multi-chamber MBE apparatus ($2\times10^{-10}$ Torr).

First, a non-doped GaAs collector layer 1 having a thickness of about 100 nm was formed on a (011) phase of the $n^+$-GaAS substrate in the first chamber of the MBE apparatus. Next, the wafer was transferred into the second chamber of the MBE apparatus, and an interlayer insulating film of $CaF_2$ was formed thereon to have a thickness of about 200 nm. An aperture of 50×50 µm² in size that reaches the GaAs collector layer 1 was formed in the interlayer insulating film. The aperture determines the area of Schottky junction between the base B and the GaAs collector layer 1.

Next, an Fe layer 3 of about 1 nm thickness, a Cu layer 5 of about 5 nm thickness and a Co layer 7 of about 1 nm thickness were formed on the collector layer 1 at each layer's growing speed of about 0.3 nm/min, using a Knudsen cell. Each layer of the base B was predominantly grown so as to have the (111) face oriented in direction perpendicular to each surface of the layers.

Next, a tunnel barrier layer comprising the CoO layer 13 of about 1 nm thickness and the $Al_2O_3$ layer 15 of about 1 nm thickness was formed on the base B, in the third chamber of the MBE apparatus. The magnetization of the Co layer 7 was pinned in its direction of [110] in a magnetic field of about 5000 Oe in the in-plane [110] direction of the Co layer in an atmosphere having an $O_2$ partial pressure of $10^{-5}$ Torr. The $Al_2O_3$ layer 15 having a thickness of about 1.5 nm was formed on the CoO layer 13 by using an Al source under an $O^2$ partial pressure of $10^{-5}$ Torr.

The substrate having the layers laminated as above described was transferred into the second chamber of the MBE apparatus, and an interlayer insulating film of $CaF_2$ having a thickness of about 200 nm was formed thereon. An aperture having an area of about 50×50 µm² was formed through the interlayer insulating film of $CaF_2$ so that the aperture determines the size of the tunnel junction between the base B and the emitter. Next, an Al layer 11 having a thickness of about 100 nm was formed on the tunnel barrier laminate structure 17 as well as the interlayer insulating film of $CaF_2$.

Figure 6:
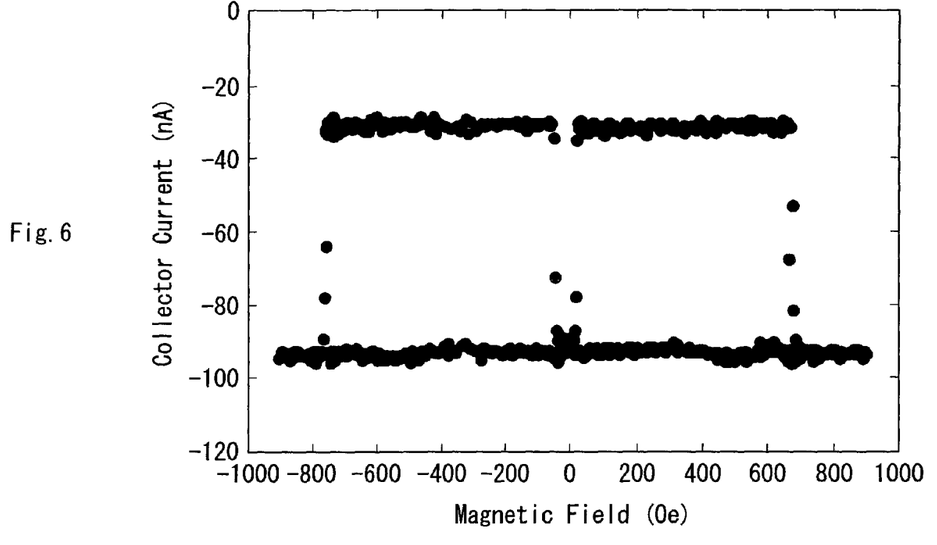
FIG. 6 is a graph showing the collector current (nA) vs. the magnetic field (Oe) of a spin-tunnel transistor of Example 1 of the present invention.

An in-plane magnetic field, which was parallel to the surface of the layers was applied to measure the dependency of the collector current to the applied magnetic field. FIG. 6 is a graph showing the characteristic of the collector current (nA) relative to the magnetic field (Oe) of the spin-tunnel transistor fabricated herein. A voltage of 1.5 V was applied between the emitter Al layer 11 and the base B through the terminals.

In FIG. 6, some current fluctuations in large and small magnetic fields were observed. The current fluctuation at the small magnetic field of about 20 Oe corresponded to the coercive force of the Fe layer 3, and the other current fluctuation at the large magnetic field of about 700 Oe corresponded to the coercive force of the magnetization pinned Co layer 7. The MR ratio of the device was about 200%, and a transfer ratio of the collector current to the emitter current (collector current/emitter current) thereof was $1.2\times10^{-4}$.

Example 2

In the Example 2, a spin-tunnel transistor of FIG. 1 was fabricated. The tunnel barrier layer 9 of the Example 2 was formed of a single layer of CoO having a thickness of about 2 nm.

In the example 2, each layers of the spin-tunnel transistor was fabricated in the same manner as in Example 1, except that it has the tunnel barrier layer 9 of single layer of CoO. Namely, the base B including an Fe layer 3, a Cu layer 5 and a Co layer 7, the tunnel barrier layer 9 of CoO, and an Al emitter layer 11 were formed on an n-GaAS substrate via a non-doped GaAs collector layer 1, using interlayer insulating film of $CaF_2$. Like in Example 1, the collector layer 1 and the layers of the base B were formed to have substantial (111)-orientation in parallel to each surface of the layers.

An in-plane magnetic field was applied to the layers formed on the substrate, and the dependency of the collector current to the applied magnetic field was measured. As a result, the collector current fluctuation corresponding to the coercive force of the Fe layer 3 was observed at magnetic field of about 20 Oe as in Example 1, however the collector current fluctuation corresponding to the coercive force of the magnetization pinned Co layer 7 was observed at magnetic field of about 1000 Oe. The MR ratio of the spin-tunnel transistor was about 160%, and the transfer ratio of the transistor was $9\times10^{-5}$.

Comparative Example

A comparative spin-tunnel transistor was also fabricated. The spin-tunnel transistor comprised a base B of an Fe layer 3, a Cu layer 5 and a Co layer 7, a tunnel barrier layer of $Al_2O_3$ 9 and an Al emitter layer 11, all formed in that order on an n-GaAs substrate via a non-doped GaAs collector layer 1. The Fe layer 3 was a magnetization free layer and the Co layer 7 was a magnetization pinned layer. The collector layer 1 and the layers 3, 5, 7 of the base B had the crystal phase orientation of (111) like in the Example 1.

The comparative spin-tunnel transistor was fabricated in the same manner as in the Example 1, while this transistor differs in that its tunnel barrier layer 9 was a layer of $Al_2O_3$ alone having a thickness of about 1.5 nm.

An in-plane magnetic field in a predetermined direction was applied to the comparative transistor, and a dependency of the collector current to the magnetic field was measured. The current fluctuation corresponding to the coercive force of the magnetization free Fe layer 3 was about 20 Oe, but the fluctuation corresponding to the coercive force of the magnetization pinned Co layer 7 was about 100 Oe, which is much smaller than that In the Example 1. The MR ratio of the transistor was about 160%, and the transfer ratio of the transistor was $1.2\times10^{-4}$.

Example 3

In Example 3, a spin-tunnel transistor having a tunnel barrier layer of a nonmagnetic material formed between the base and the emitter was fabricated, and the spin-tunnel transistor had a tunnel barrier layer of an antiferromagnetic material between the base and the collector.

A CoO tunnel barrier layer was formed between the emitter layer of Al and the base B, and the magnetization of the ferromagnetic layer adjacent to the CoO tunnel barrier layer was fixed by an antiferromagnetic coupling of the two layers. An $Al_2O_3$ tunnel barrier layer was formed between the base B and the collector layer.

In this Example, each layer of the spin-tunnel transistor were formed in the same multi-chamber MBE apparatus as that used in Example 1. The CoO tunnel barrier layer having a thickness of about 3 nm was formed on an n-Si substrate via an Al collector layer having a thickness of about 100 nm. A base B that comprises a Co layer having a thickness of about 2 nm on the CoO tunnel barrier layer, a Cu layer 5 having a thickness of about 5 nm on the Co layer and an Fe layer 3 having a thickness of about 1 nm on the Cu layer was formed. The $Al_2O_3$ tunnel barrier layer having a thickness of about 1.5 nm was formed on the base B, and an Al emitter layer were formed on the tunnel barrier layer. The magnetization of the Co layer was fixed by an exchange coupling with the adjacent CoO tunnel barrier layer.

Like in Example 1, a voltage of 1.5 V was applied between the Al emitter layer and the base B, and the coercive force of the Co layer and that of the Fe layer were measured through an application of magnetic field, whereas the collector current fluctuation was observed at 800 Oe and 20 Oe, respectively. The MR ratio of the device was about 100%, and a transfer ratio of the collector current to the emitter current (collector current/emitter current) thereof was $1.0 \times 10^{-4}$.

Example 4

In Example 4, a spin-tunnel transistor having a base and an emitter formed via a tunnel barrier layer to have a MIS structure, in which the tunnel barrier layer was formed of an antiferromagnetic film 17 as in FIG. 3. In this Example 4, the emitter was formed of a substrate, and the base and a collector were formed on the emitter where the base was sandwiched between the collector and the emitter.

This multi-layer was fabricated in the same multi-chamber MBE apparatus as in Example 1. A base B that comprises an Fe layer having a thickness of about 1 nm, a Cu layer having a thickness of about 5 nm and a Co layer having a thickness of about 1 nm was formed on an emitter n-Si substrate via a tunnel barrier layer of $Al_2O_3$ having a thickness of about 0.5 nm. Then, another tunnel barrier layer of CoO having a thickness of about 3 nm and an Al collector layer having a thickness of about 100 nm were formed on the base B. The Co layer has a magnetization fixed by an exchange-coupling between the adjacent CoO layer.

A voltage of about 1.0 V was applied between the n-Si emitter and the base of the spin-tunnel transistor of the present example, and the coercive force of the Co layer and the Fe layer were measured through magnetic field, whereby observing magnetic field dependency of the collector current of the spin-tunnel transistor. They were 800 Oe and 20 Oe, respectively. The MR ratio of the device was about 100%, and a transfer ratio of the collector current to the emitter current (collector current/emitter current) thereof was $1.0 \times 10^{-4}$.

As described hereinabove, the spin-tunnel transistor of the present invention may be used as a sensor device, for example a magnetic information reproducing heads. The magnetic information reproducing head for reading magnetic information of recording medium may have a pair of shield layers sandwiching the spin-tunnel transistor of the present invention so as to shield the transistor from an interfering magnetic field of neighboring bits of magnetic recording medium.

The magnetic information reproducing head using the spin-tunnel transistor of the present invention may be used in a magnetic information system such as Hard Disc Drives. In addition, the spin-tunnel transistor of the invention may also be used in the memory part of memory devices such as ROM, wherein the magnetization free layer of the transistor functions a memory layer and the magnetization fixed layer of the transistor functions as a reference layer.

Some embodiments of the invention have been described hereinabove with reference to their examples; however, the invention is not limited to the described embodiments and examples. For example, the concrete dimensions and the materials of the constitutive elements of the spin-tunnel transistor, and also the shapes and the materials of the substrates, the electrodes, the conductivity types, the dopants and the insulating structures may be appropriately selected and modified in carrying out the invention.

Directly as it is or after suitably modified, the structure of the spin valve film used in conventional/future GMR devices may also be used in fabricating the spin-tunnel transistor of the invention. Regarding the materials of the magnetization free layer, the nonmagnetic layer, the magnetization pinned layer, the emitter layer and the collector layer that constitute the transistor, these layers may have a single-layered structure or may have a multi-layered structure of different types of layers.

The wording "on" used herein for indicating the positional relationship of the constituent layers does not means that the two layers are necessarily in direct contact with each other, but any other layer may be formed between the layers.

As described hereinabove with reference to its some embodiments and examples, the invention provides a spin-tunnel transistor which has an sufficient collector current and MR ratio and functions in a stable manner.

Obviously, numerous modifications and variations of the present invention are possible in light of the above teachings. It is therefore to be understood that within the scope of the appended claims, the invention may be practiced otherwise than as specifically described herein.

What is claimed as new an desired to be secured by Letters Patent of the Unites States is:

1. A spin-tunnel transistor, comprising:
   an emitter;
   a collector formed adjacent to the emitter;
   a base formed between the emitter and the collector and having a magnetization pinned layer of ferromagnetic material, a magnetization free layer of ferromagnetic material and a nonmagnetic layer between the magnetization pinned layer of ferromagnetic material and the magnetization free layer of ferromagnetic material, the magnetization pinned layer having a magnetization substantially fixed in an applied magnetic field, the magnetization free layer having a magnetization substantially free to rotate under the applied magnetic field, and the nonmagnetic layer being configured to decouple exchange coupling between the magnetization free layer of ferromagnetic material and the magnetization pinned layer of ferromagnetic material, the base including an electrode configured to apply a voltage between the emitter and the base; and
   a tunnel barrier layer of antiferromagnetic material formed between the magnetization pinned layer of ferromagnetic material and the emitter or between the collector and the magnetization pinned layer of ferromagnetic material and provided with an exchange coupling with an adjoining one of the magnetization pinned layer of ferromagnetic material, the tunnel barrier layer being dielectric and tunnel conductive, and the magnetization of the magnetization pinned layer of ferromagnetic material being fixed by the exchange coupling between the magnetization pinned layer of ferromagnetic material and the tunnel barrier of anti ferromagnetic material.

2. A spin-tunnel transistor of claim 1, wherein the antiferromagnetic material is cobalt oxide, iron oxide or nickel oxide.

3. A spin-tunnel transistor of claim 1, further comprising a dielectric layer of nonmagnetic material formed in contact with the tunnel barrier layer of antiferromagnetic material.

4. A spin-tunnel transistor of claim 1, wherein the magnetization pinned layer includes a metal selected from the group consisting of Fe, Co, Ni, or an alloy containing the metal, and the tunnel barrier layer of antiferromagnetic material contains an oxide of the metal.

5. A spin-tunnel transistor of claim 1, wherein the tunnel barrier layer of antiferromagnetic material is formed between the magnetization pinned layer and the emitter, and the emitter includes a semiconductor surface contacting the tunnel barrier layer of antiferromagnetic material.

6. A spin-tunnel transistor of claim 1, further comprising another tunnel barrier layer of nonmagnetic dielectric material formed in contact with the magnetization free layer of ferromagnetic material.

7. A magnetic reproducing head, comprising:
a spin-tunnel transistor comprising:
an emitter;
a collector formed adjacent to the emitter;
a base formed between the emitter and the collector and having a magnetization pinned layer of ferromagnetic material, a magnetization free layer of ferromagnetic material and a nonmagnetic layer between the magnetization pinned layer of ferromagnetic material and the magnetization free layer of ferromagnetic material, the magnetization pinned layer having a magnetization substantially fixed in an applied magnetic field, and the magnetization free layer having a magnetization substantially free to rotate under the applied magnetic field, the base including an electrode configured to apply a voltage between the emitter and the base; and
a tunnel barrier layer of antiferromagnetic material formed between the magnetization pinned layer of ferromagnetic material and the emitter or between the collector and the magnetization pinned layer of ferromagnetic material and provided with an exchange coupling with an adjoining one of the magnetization pinned layer of ferromagnetic material, the tunnel barrier layer being dielectric and tunnel conductive, and the magnetization of the magnetization pinned layer of ferromagnetic material being fixed by the exchange coupling between the magnetization pinned layer of ferromagnetic material and the tunnel barrier of antiferromagnetic material.

8. A magnetic reproducing head of claim 7, wherein the collector is electrically coupled with an electrical field effect transistor, and the spin-tunnel transistor and the electrical field effect transistor are formed on a same substrate.

9. A magnetic reproducing head, comprising:
a spin-tunnel transistor comprising:
an emitter;
a collector formed adjacent to the emitter;
a base formed between the emitter and the collector and having a magnetization pinned layer of ferromagnetic material, a magnetization free layer of ferromagnetic material and a nonmagnetic layer between the magnetization pinned layer of ferromagnetic material and the magnetization free layer of ferromagnetic material, the magnetization pinned layer having a magnetization substantially fixed in an applied magnetic field, the magnetization free layer having a magnetization substantially free to rotate under the applied magnetic field; and, the nonmagnetic layer being configured to decouple exchange coupling between the magnetization free layer of ferromagnetic material and the magnetization pinned layer of ferromagnetic material, the base including an electrode configured to apply a voltage between the emitter and the base; and
a tunnel barrier layer of antiferromagnetic material formed between the magnetization pinned layer of ferromagnetic material and the emitter or between the collector and the magnetization pinned layer of ferromagnetic material and provided with an exchange coupling with an adjoining one of the magnetization pinned layer of ferromagnetic material, the tunnel barrier layer being dielectric and tunnel conductive, and the magnetization of the magnetization pinned layer of ferromagnetic material being fixed by the exchange coupling between the magnetization pinned layer of ferromagnetic material and the tunnel barrier of antiferromagnetic material.

10. The magnetic reproducing head of claim 9, wherein the collector is electrically coupled with an electrical field effect transistor, and the spin-tunnel transistor and the electrical field effect transistor are formed on a same substrate.

* * * * *